United States Patent [19]
Hong

[11] Patent Number: 5,746,326
[45] Date of Patent: May 5, 1998

[54] SHELF UNIT WITH A SPRING FOR USE IN A RACK FOR STORING A COMMUNICATION SYSTEM

[75] Inventor: Kee-Chul Hong, Incheon, Rep. of Korea

[73] Assignee: Daewoo Telecom Ltd., Rep. of Korea

[21] Appl. No.: 764,099

[22] Filed: Dec. 6, 1996

[30] Foreign Application Priority Data

Dec. 8, 1995 [KR] Rep. of Korea .................. 95-47701

[51] Int. Cl.$^6$ .................................................. A47G 19/08
[52] U.S. Cl. ............................................ 211/41.17; 361/800
[58] Field of Search .................................. 361/800, 796; 211/26.2, 41.17

[56] References Cited

U.S. PATENT DOCUMENTS

| | | | |
|---|---|---|---|
| 4,872,212 | 10/1989 | Roos et al. ................... | 361/800 X |
| 5,343,361 | 8/1994 | Rudy, Jr. et al. ............. | 361/800 X |
| 5,479,321 | 12/1995 | Mair et al. ................... | 361/800 X |
| 5,504,657 | 4/1996 | Stocco ........................... | 361/800 |

FOREIGN PATENT DOCUMENTS 2263199 7/1993 United Kingdom .................. 361/800

*Primary Examiner*—Blair Johnson
*Attorney, Agent, or Firm*—Pennie & Edmonds LLP

[57] ABSTRACT

A shelf unit with a spring in a communication system includes a front plate having a fixing portion and a projecting portion with a recessed portion backwardly extended at both ends thereof, respectively, and a spring inserted into the projecting portion of the front plate. The spring having a substantial v-shaped configuration includes a plurality of spring members defined in a predetermined size at one side thereof and a body integrally formed at the other side thereof. Each of the spring members includes an elastic portion having a bending portion inwardly bent at an end thereof and a compressing portion provided within the elastic portion and inwardly bent relative to the elastic portion, thereby allowing the compressing portion to be tightly fitted into the recessed portion. The compressing portion further includes an abutment portion upwardly bent at the end of the compressing portion and downwardly bent about the bent portion thereof, thereby allowing the spring to be easily inserted along the projecting portion. The elastic portion is biased by coming into a contact with the fixing portion of the right side unit, thereby preventing electromagnetic waves from being radiated through a gap between the neighboring units.

4 Claims, 5 Drawing Sheets 5,746,326

SHELF UNIT WITH A SPRING FOR USE IN A RACK FOR STORING A COMMUNICATION SYSTEM

FIELD OF THE INVENTION

The present invention relates to a shelf unit with a spring for use in a rack for storing a communication system; and, more particularly, to a shelf unit with a spring capable of shielding electromagnetic waves of a shelf.

DESCRIPTION OF THE PRIOR ART

As is well known, a rack for storing a communication system consists of a plurality of shelves, each of the shelves being capable of accommodating a number of units, each of the units being disposed with a number of electronic parts.

There is shown in FIG. 1 a typical shelf 10 comprising four frames 20 transversely disposed at tops and bottoms of a front portion and a rear portion thereof, respectively, a pair of side plates 2 fixed at right and left ends of the four frames 20, respectively, and a back plate 4 disposed at the rear portion of the shelf 10, to thereby form a hexahedron. On the other hand, a plurality of guide rails 14 are mounted inside of the tops and the bottoms of the four frames 20 at regular intervals between the side plates 2.

A number of units 30 are detachably inserted into each of the guide rails 14 of the shelf 10, each of the units 30 being regularly spaced apart. The unit 30 includes a printed circuit board 12, a front plate 16, and a unit connector 8 connected to a connector 6 disposed on the back plate 4. A gap 18 is formed between the adjacent front plates 16. The unit 30 further includes an ejector 22 mounted at a top and a bottom of the front plate 16 in order to easily connect and disconnect the unit connector 8 with the connector 6.

In general, various electromagnetic waves are radiated during the operation of the communication system, including electromagnetic waves which cause electromagnetic interference("EMI"). One of the major shortcomings of the conventional shelf as described above is that the shelf is incapable of shielding the electronic waves within the shelf as a result of the presence of the gap between the adjacent front plates of the units as shown in FIG. 1.

SUMMARY OF THE INVENTION

It is, therefore, a primary object of the invention to provide a shelf unit with a spring for use in a rack for storing a communication system, which is capable of effectively shielding electromagnetic waves.

The above and other objects of the present invention are accomplished by providing a shelf unit with a spring for use in a rack for storing a communication system, the shelf unit comprising:

a front plate having a fixing portion for mounting a printed circuit board and a projecting portion backwardly extended at both ends thereof, respectively, the projecting portion having a recessed portion;

a spring having a v-shaped configuration and inserted into the projecting portion of the front plate, wherein the spring includes a plurality of spring members defined in a predetermined size at one side thereof and a body integrally formed at the other side thereof, each of the spring members including an elastic portion having a bending portion inwardly bent at an end thereof, an inner portion of the elastic portion being cut out so as to form a rim at an edge thereof, and a compressing portion provided within the elastic portion and inwardly bent relative to the elastic portion.

BRIEF DESCRIPTION OF THE DRAWINGS

The above and other objects, features and advantages of the present invention will become apparent from the following detailed description, when taken in conjunction with the accompanying drawings, in which.

DETAILED DESCRIPTION OF THE PREFERRED EMBODIMENTS

Figure 1:
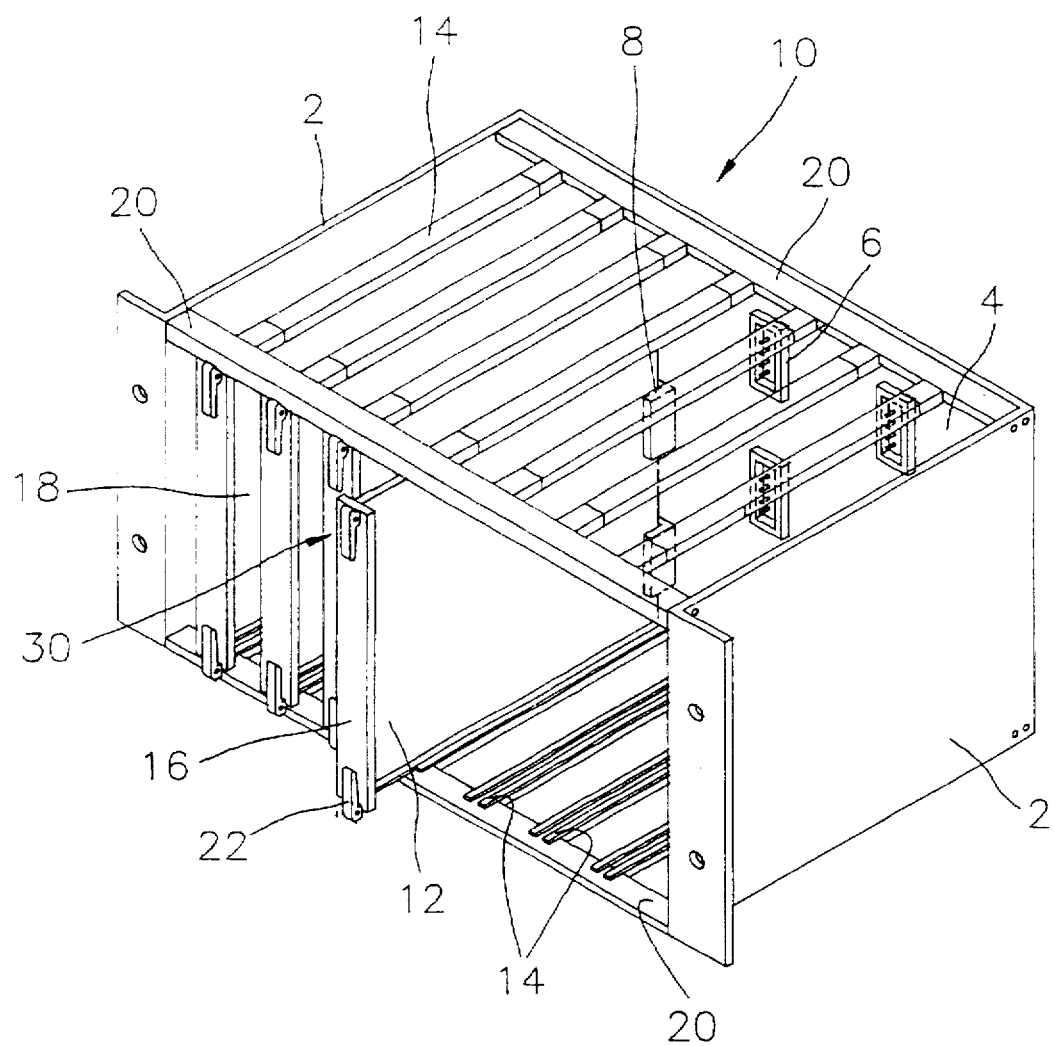
FIG. 1 shows a perspective view of a conventional shelf for storing a communication system.
Figure 2:
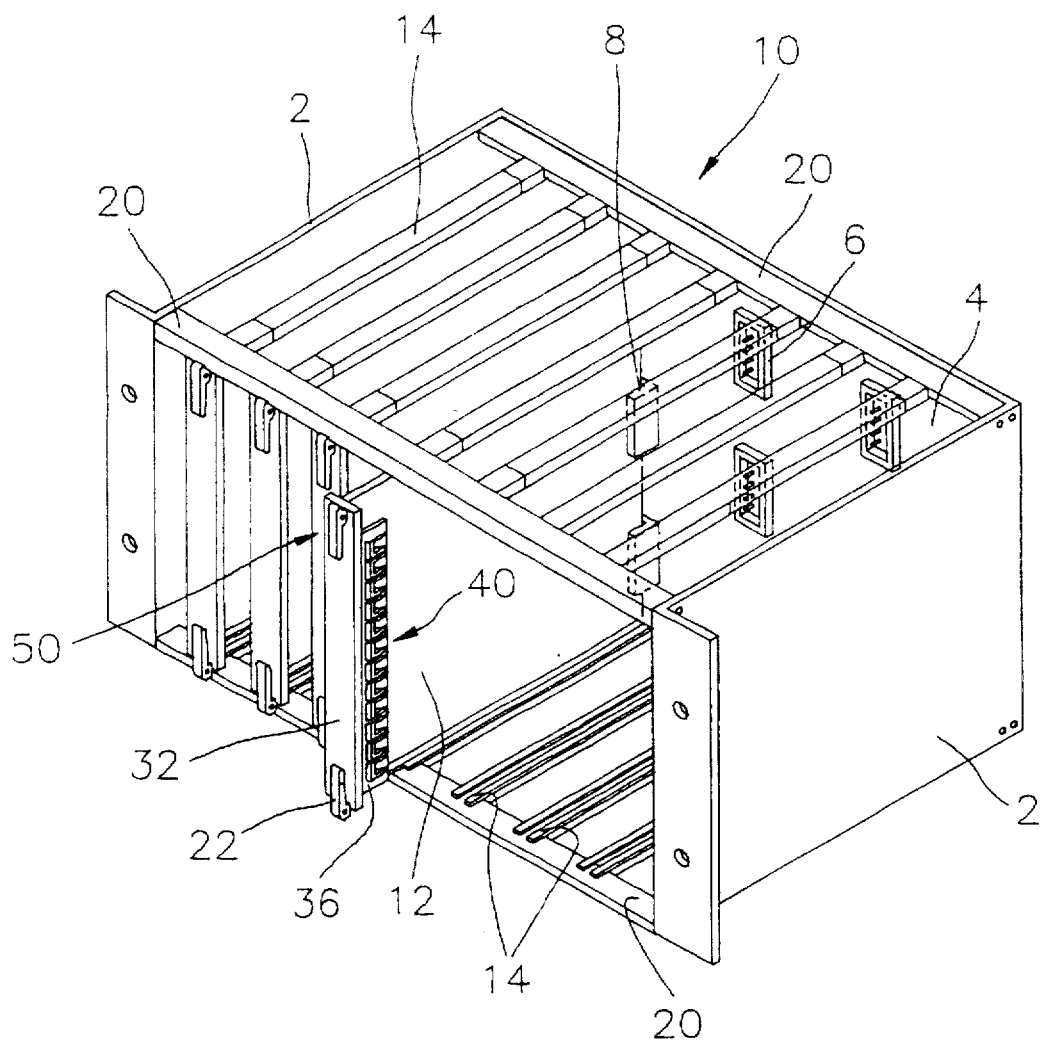
FIG. 2 represents a perspective view of a shelf having an inventive shelf unit with a spring in accordance with the present invention.
Figures 6, 6A:
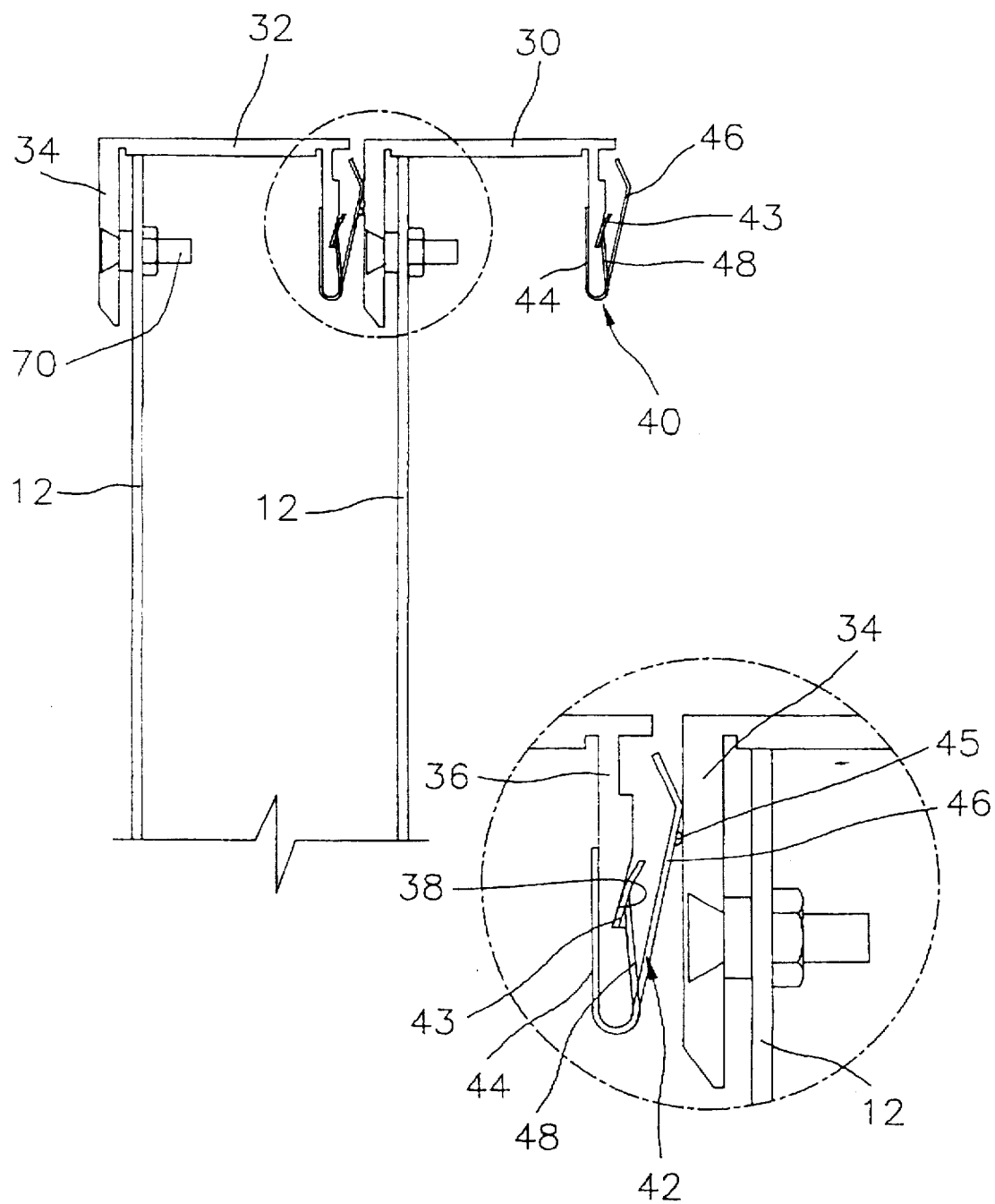
FIG. 6 offers a schematic plan view showing a condition for shielding electric waves in the shelf unit with the spring in accordance with the present invention and FIG 6A is a partial enlarged view of FIG 6.

Referring now to FIG. 2, there is shown an inventive shelf unit with a spring in accordance with a preferred embodiment of the invention. The shelf unit 50 shown therein includes a front plate 32 having a fixing portion 34 (in FIG. 6) and a projecting portion 36 inwardly extended at right and left ends of the front plate 32, respectively, and a spring 40 fitted onto the projecting portion 36 of the front plate 32. In FIG. 6, the projecting portion 36 of the front plate 32 is provided with a recessed portion 38 thereon.

Figure 3:
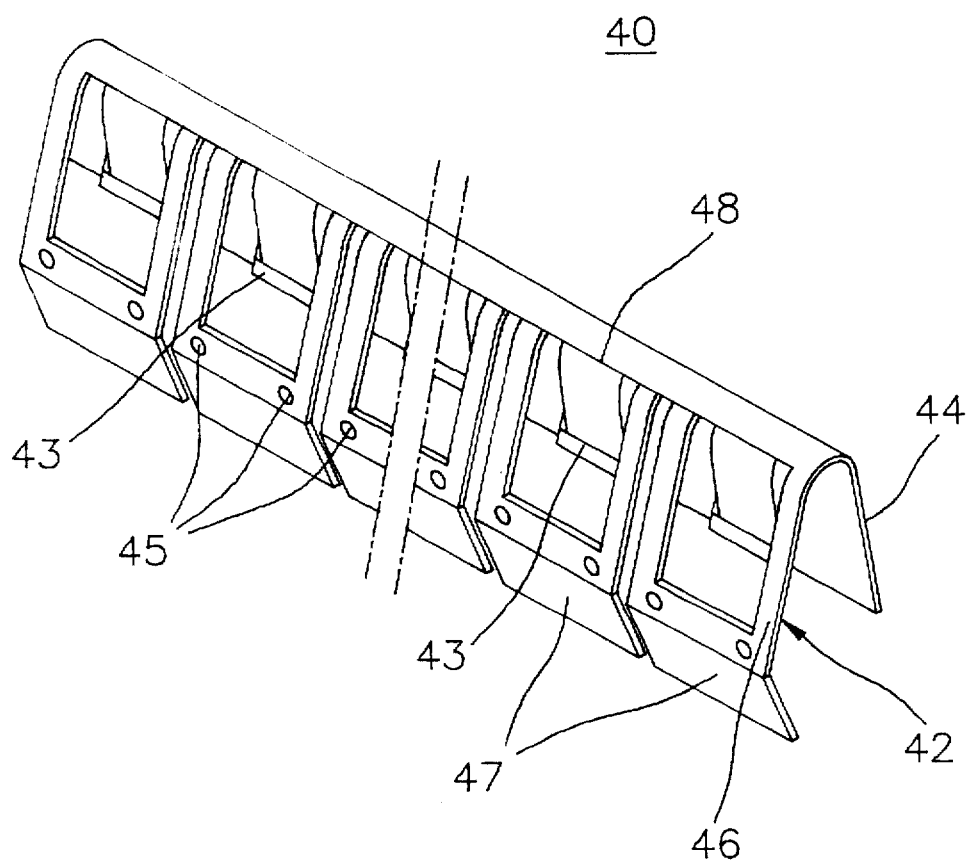
FIG. 3 provides a partially cut out perspective view of the spring in FIG. 2.
Figure 4:
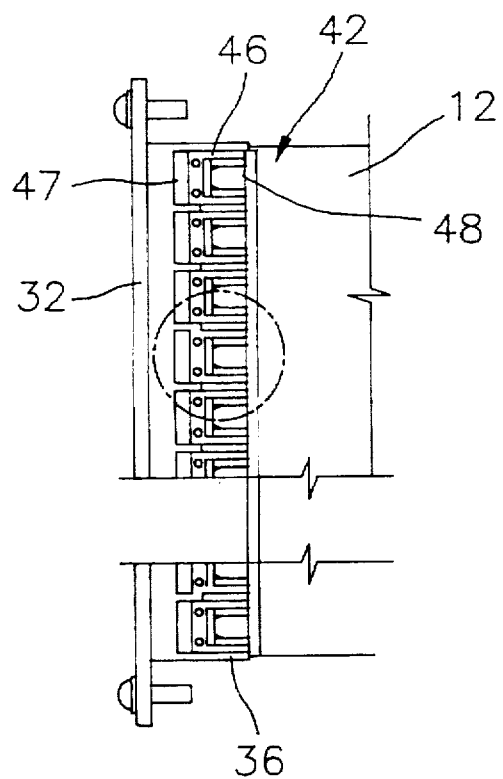
FIG. 4 describes a partially sectional view showing the spring inserted into the shelf unit of FIG. 2.
Figure 5:
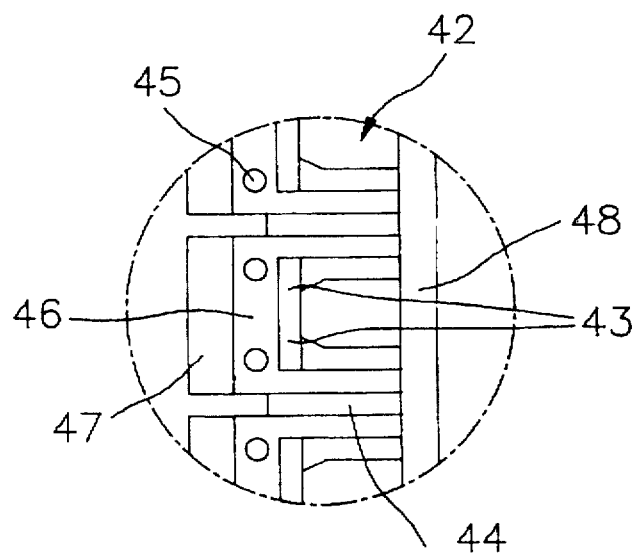
FIG. 5 illustrates a detailed view of the portion within the circle in FIG. 4.

As shown in FIGS. 3 to 5, the spring 40 having a substantially v-shaped configuration includes a body 44 and a plurality of spring members 42 connected at one end and arranged in line along the body. Each of the spring members 42 includes an elastic portion 46 having an inwardly bending end portion 47 thereof, an inner portion of the elastic portion 46 being cut out so as to form a rim at an edge thereof, and a compressing portion 48 provided between the elastic portion 46 and the body 44 and inwardly bent relative to the elastic portion 46, thereby allowing the compressing portion 48 to be tightly fitted into the recessed portion 38 of the projecting portion 36.

Further, it is preferable that the body 44 and the each of the spring members 42 further include a plurality of protrusions 45 formed at the outer surface thereof and as shown in FIGS. 3 and 5 a pair of protrusions 45 formed on the rim adjacent to the bending portion 47, respectively.

As best shown in FIG. 6, a printed circuit board 12 is mounted by a fastening means 70 to the fixing portion 34 of the front plate 32.

On the other hand, the compressing portion 48 of each of the spring members 42 further includes an abutment portion 43 bent at the end of the compressing portion 48 in such a manner that the spring 40 is allowed to be easily inserted along the projecting portion 36 of the front plate 32.

When the spring 40 in accordance with the present invention is fitted onto the projecting portion 36 of the front plate 32, the compressing portion 48 of each of the spring members 42 is tightly fitted into the recessed portion 38 of the projecting portion 36 and the elastic portion 46 of each of the spring members 42 is biased by coming into a contact with the fixing portion 34 of the adjacent right side unit 40. As a result, electromagnetic waves are prevented from penetrating through the gap 18 between the neighboring units 50. At this time, the contacting force thereof is effectively improved by the protrusions 45 formed at the outer surface of the body 44 of the spring members 42 and the protrusions 45 formed on the rim adjacent to the bending portion 47 as shown in FIG. 6A. Further, the bending portion 47 of the elastic portion 46 is inwardly bent at an end thereof, thereby preventing the printed circuit board 12 from being damaged due to the contact of the bending portion 47 therewith during the insertion of the spring 40.

Although the invention has been shown and described with respect to the preferred embodiments, it will be understood by those skilled in the art that certain changes and modifications may be made without departing from the spirit and scope of the invention as defined in the following claims.

What is claimed is:

1. A shelf unit for use in a rack for storing a communication system, the shelf unit comprises:

an elongated front plate having a fixing portion for mounting a printed circuit board and a projecting portion backwardly extended at both lateral edges thereof, respectively, the projecting portion having a recessed portion; and a spring having a substantially V-shaped configuration, the spring includes one side of said V-shaped configuration defining a body and the opposite side of said V-shaped configuration defining a plurality of spring members connected to and arranged along the body, each of the spring members including an elastic portion having a bending portion inwardly bent at an end thereof toward said body, and a compressing portion provided between the elastic portion and the body and further inwardly bent relative to the elastic portion toward said body, wherein the projecting portion is interposed between the body and the compressing portion of the spring and the elastic portion is adapted to be biased by coming into contact with the fixing portion of an adjacent front plate, to prevent electromagnetic waves from penetrating through a gap between neighboring front plates.

2. The shelf unit according to claim 1, wherein the compressing portion of each of the spring members further includes an abutment portion bent away from said body at the end of the compressing portion and inwardly bent about the bent portion thereof, toward said body thereby allowing the compressing portion to be tightly fitted into the recessed portion of the projecting portion.

3. The shelf unit according to claim 1, wherein the body and the spring members further include a plurality of protrusions formed at the outer surface thereof.

4. The shelf unit according to claim 3, wherein each spring member comprises a pair of protrusions formed on a rim portion adjacent to the bending portion.

* * * * *